United States Patent [19]

Sommer et al.

[11] Patent Number: 5,444,392
[45] Date of Patent: Aug. 22, 1995

[54] CMOS INPUT STAGE

[75] Inventors: Diether Sommer, München; Dominique Savignac, Ismaning, both of Germany

[73] Assignee: Siemens AG, Munich, Germany

[21] Appl. No.: 128,529

[22] Filed: Sep. 29, 1993

[30] Foreign Application Priority Data

Sep. 29, 1992 [EP] European Pat. Off. ............ 92116654

[51] Int. Cl.$^6$ .................. H03K 17/16; H03K 19/0175
[52] U.S. Cl. ......................................... 326/31; 326/81; 326/87
[58] Field of Search ............... 307/475, 443, 451; 326/31, 34, 81, 87

[56] References Cited

U.S. PATENT DOCUMENTS

| | | | |
|---|---|---|---|
| 4,555,642 | 11/1985 | Morales | 307/475 |
| 4,616,143 | 10/1986 | Miyamotot | 307/475 |
| 4,929,852 | 5/1990 | Bae | 307/475 |
| 4,929,853 | 5/1990 | Kim et al. | 307/475 |
| 4,937,476 | 6/1990 | Bazes | 307/475 |
| 5,021,685 | 6/1991 | Kihara | 307/475 |
| 5,313,118 | 5/1994 | Lundberg | 307/475 |

FOREIGN PATENT DOCUMENTS

| | | |
|---|---|---|
| 0405833 | 1/1991 | European Pat. Off. |
| 0467352 | 1/1992 | European Pat. Off. |
| 54-74353 | 6/1979 | Japan . |
| 1236220 | 10/1989 | Japan . |
| 4109712 | 4/1992 | Japan . |
| 8810031 | 12/1988 | WIPO . |

OTHER PUBLICATIONS

Halbleiter-Schaltungstechnik, (Tietze et al) 8th Edition 1986, pp. 211–213.

*Primary Examiner*—David R. Hudspeth
*Assistant Examiner*—Richard Roseen
*Attorney, Agent, or Firm*—Herbert L. Lerner; Laurence A. Greenberg

[57] ABSTRACT

A CMOS input stage for operation with a supply voltage selectively having a first value or a second higher value, includes a supply voltage terminal selectively receiving a first value or a second value of a supply voltage during operation, a reference potential terminal, and an input terminal. A first field effect transistor of a first conduction type has a load path and a gate terminal, and a second field effect transistor of a second conduction type has a load path and a gate terminal. The load paths of the field effect transistors are connected in series between the supply voltage terminal and the reference potential terminal. The gate terminals of the field effect transistors are connected to the input terminal. A control device adjusts a resistance of the load path of at least one of the field effect transistors as a function of a particular value selected for the supply voltage.

5 Claims, 1 Drawing Sheet

CMOS INPUT STAGE

BACKGROUND OF THE INVENTION

FIELD OF THE INVENTION

The invention relates to a CMOS input stage for operation with a supply voltage selectively having a first value or a second higher value, including a first field effect transistor of a first conduction type and a second field effect transistor of a second conduction type having load paths being connected in series between a supply voltage terminal and a reference potential terminal, the first value or the second value of the supply voltage being selectively applied to the supply voltage terminal during operation, and an input terminal being connected to gate terminals of the two field effect transistors.

CMOS input stages have been known for a long time and are described in detail in the book entitled: Halbleiter-schaltungstechnik [Semiconductor Circuitry] by Tietze and Schenk, 8th Edition, 1986, page 211 ff., for instance. FIG. 9.36 thereof shows a CMOS inverter that is constructed as such an input stage. Depending on the input voltage, the output voltage of the inverter is equal to either the supply voltage $V_{DD}$ or ground, because one of the transistors T1 or T2 is always made conducting.

In order to assure the lowest possible failure rates, integrated circuits are run in what is known as a burn-in mode after their manufacture. Such a burn-in mode guarantees that so-called premature failures will be recognized as early as possible by means of simulated aging. In the burn-in mode, the integrated circuits are operated at an elevated voltage, such as 8 V. That sets an accelerated aging process in motion, and the aforementioned premature failures can thus be recognized very quickly.

One problem in such an operating mode is that with the elevation of the supply voltage, the thresholds of the input stages are also increased. Particularly in components that are operated externally at 5 V and internally at 3.3 V, for instance, the burn-in is performed in a test mode, in which the regulators are turned off in order to reduce the external supply voltage to 3.3 V. As a result the internal supply voltage becomes equal to the external supply voltage. If a component has that test option, it cannot be assured that the component will not unintentionally jump to that test mode when it is turned on. If that happens, then because of the shift in thresholds of the input stages, the component can no longer, as specified, be put into a basic state with a TTL level at an application control input, because a logical "high" at an input is no longer recognized. In memory components, the control input is RAS, for instance, and the basic state is established by eight RAS-only cycles, for example.

SUMMARY OF THE INVENTION

It is accordingly an object of the invention to provide a CMOS input stage, which overcomes the hereinafore-mentioned disadvantages of the heretofore-known devices of this general type and which makes it possible to meet a TTL specification even in a burn-in mode with an elevated supply voltage.

With the foregoing and other objects in view there is provided, in accordance with the invention, a CMOS input stage for operation with a supply voltage selectively having a first value or a second higher value, comprising a supply voltage terminal selectively receiving a first value or a second value of a supply voltage during operation, a reference potential terminal, and an input terminal; a first field effect transistor of a first conduction type having a load path and a gate terminal, and a second field effect transistor of a second conduction type having a load path and a gate terminal; the load paths of the field effect transistors being connected in series between the supply voltage terminal and the reference potential terminal; the gate terminals of the field effect transistors being connected to the input terminal; and control means for adjusting a resistance of the load path of at least one of the field effect transistors as a function of a particular value selected for the supply voltage.

In accordance with another feature of the invention, there is provided a connection terminal for a threshold reversal signal; the control means having two further field effect transistors of the second conduction type with load paths and gate terminals; the load paths of the further field effect transistors being connected in a series circuit, the series circuit being parallel to the load path of the second field effect transistor; the gate terminal of one of the further field effect transistors being connected to the input terminal, and the gate terminal of the other of the further field effect transistors being connected to the connection terminal for the threshold reversal signal.

In accordance with a further feature of the invention, there is provided a connection terminal for a threshold reversal signal; the control means having two further field effect transistors of the first conduction type with load paths and gate terminals; the load paths of the further field effect transistors being connected in parallel and being connected on the supply voltage side between the supply voltage terminal and the series connection or circuit of the load paths of the first and second field effect transistors; the gate terminal of one of the further field effect transistors being connected to the input terminal, and the gate terminal of the other of the further field effect transistors being connected to the connection terminal for the threshold reversal signal.

With the objects of the invention in view, there is also provided a CMOS buffer stage, comprising the CMOS input stage; an inverter having an input connected downstream of an output voltage side of the CMOS input stage and having an output; and a holding field effect transistor having a load path connected parallel to the load path of the first field effect transistor and having a gate terminal being connected to the output of the inverter.

Through the use of reversible thresholds of the input buffers of an integrated circuit, it is possible to assure that the threshold of the switching transistors will remain constant even at an elevated supply voltage in the burn-in mode.

Other features which are considered as characteristic for the invention are set forth in the appended claims.

Although the invention is illustrated and described herein as embodied in a CMOS input stage, it is nevertheless not intended to be limited to the details shown, since various modifications and structural changes may be made therein without departing from the spirit of the invention and within the scope and range of equivalents of the claims.

The construction and method of operation of the invention, however, together with additional objects

DESCRIPTION OF THE PREFERRED EMBODIMENTS

Figure 1:
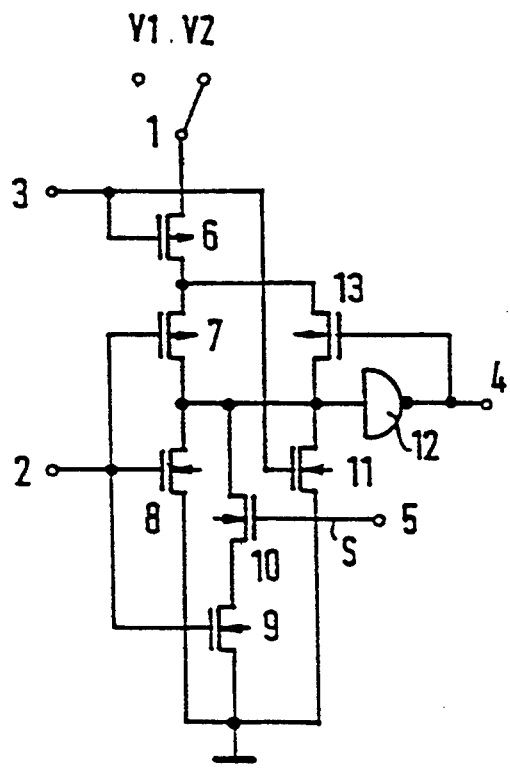
FIG. 1 is a schematic circuit diagram of a first exemplary embodiment of a CMOS input stage according to the invention with a reversible threshold in n-channel technology.

Referring now to the figures of the drawing in detail and first, particularly, to FIG. 1 thereof, there is seen an input stage that has an input terminal 1, to which a supply voltage can be applied. The supply voltage terminal 1 selectively receives a first value V1 or a second higher value V2 of a supply voltage during operation. This connection terminal 1 is connected to ground through a series circuit of load paths of two p-channel field effect transistors 6, 7 and one n-channel field effect transistor 8. The load path of the n-channel field effect transistor 8 is connected to ground. A gate terminal of the p-channel field effect transistor 6 is connected to an input terminal 3. An enable signal can be applied at this input terminal 3. Gate terminals of the p-channel field effect transistor 7, which may be referred to as a first transistor, and of the n-channel field effect transistor 8, which may be referred to as a second transistor, are interconnected with one another and with an input terminal 2. A series circuit of the load paths of the n-channel field effect transistor 8 and the p-channel field effect transistor 7 has a node point that is connected to an input of an inverter 12. An output of the inverter 12 is connected to an output terminal 4 and to a gate terminal of a holding p-channel field effect transistor 13. A load path of the p-channel field effect transistor 13 is connected parallel to the load path of the p-channel field effect transistor 7. A load path of an n-channel field effect transistor 11 is connected between the input of the inverter 12 and ground. A gate terminal of this n-channel field effect transistor 11 is connected to the connection terminal 3. A series circuit of load paths of two n-channel field effect transistors 9 and 10 is also connected between the input of the inverter 12 and ground. A gate terminal of the field effect transistor 9 which is located on the ground side of the series circuit is connected to the input terminal 2. A gate terminal of the field effect transistor 10 is connected with a further input terminal 5 for a threshold reversal signal S. The further field effect transistors 9, 10 form control means for adjusting a resistance of the load path of at least one of the field effect transistors 7, 8 as a function of the particular value V1 or V2 selected for the supply voltage.

The actual CMOS input stage is formed by the transistors 7 and 8 which are interconnected in a known manner. The known field effect transistors 6 and 11 and the associated connection terminal 3 serve as an enable circuit and play no role in the function of the configuration according to the invention. The inverter 12 and the associated fed-back field effect transistor 13 represent an inverting buffer stage, through which the entire configuration is made into a non-inverting CMOS input stage. These elements represent an advantageous embodiment of the invention for adjusting hysteresis. The actual configuration according to the invention for varying thresholds includes the two field effect transistors 9 and 10. Through the use of these two field effect transistors, the junction resistance of the load path of the switching transistor 8 can be varied.

If a logical 0 signal is present as a threshold reversing signal S at the input terminal 5, then the field effect transistor 10 is deactivated, and from then on the field effect transistor 9 plays no further role in the circuit function. Conversely, if a logical 1 signal is present as a threshold reversal signal S at the input terminal 5, then the field effect transistor 10 is in the conducting state, and as a result the load paths of the field effect transistors 8 and 9 are connected quasi-parallel. This effect can be optimized by making the field effect transistor 10 substantially larger in size than the field effect transistor 9. In that case, in the circuit state described, virtually only the field effect transistor 9 is in fact operative. This lowers the effective junction resistance between the input of the inverter 12 and ground. Through the use of these provisions, the threshold of the input stage is varied. At an elevated supply voltage, such as 6 V or 8 V, it is possible through the use of this provision, depending on the dimensioning of the transistors, to keep the threshold constant as compared to operation with a supply voltage of 5 V. A node 20 between the FET 7 and FET 8 forms an output terminal of the input stage.

Figure 2:
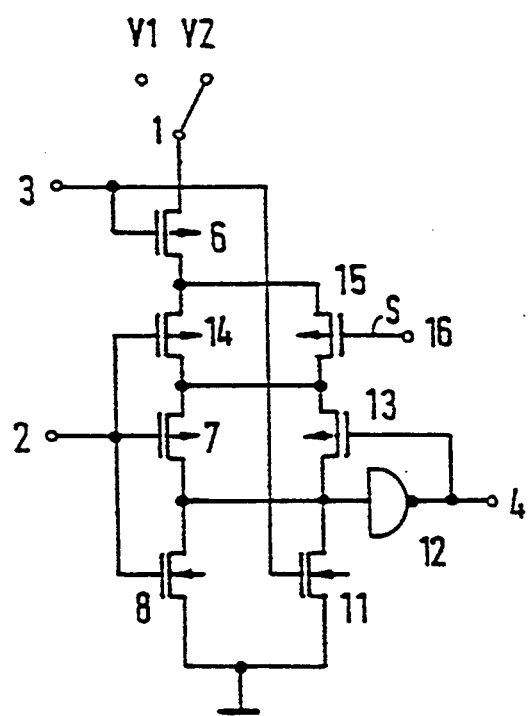
FIG. 2 is a circuit diagram of a second exemplary embodiment of a CMOS input stage according to the invention with a reversible threshold in p-channel technology.

FIG. 2 shows an embodiment of the invention with a threshold reversing switch in p-channel technology. Identical elements are provided with the same reference numerals as in FIG. 1. An identical enable circuit device is provided, including the connection terminal 3 and the two transistors 6 and 11. Once again, the input stage is represented by the input terminal 2 and the two complementary transistors 7 and 8. An inverting holding stage is also shown, including the inverter 12 and the fed-back transistor 13. Finally, the output terminal 4 is also connected as in FIG. 1.

The threshold switching device or control means of the invention is provided in this case by two transistors 14 and 15. The threshold reversal signal S can be applied through the connection terminal 16. Load paths of the p-channel switching transistors 14 and 15 are connected parallel. The parallel-connected load paths of the field effect transistors 14 and 15 are connected between the load path of the p-channel field effect transistor 6 and the load path of the p-channel field effect transistor 7. A gate terminal of the p-channel field effect transistor 14 is connected with the input terminal 2, and a gate terminal of the field effect transistor 15 is connected with the connection terminal 16. As in FIG. 1, the node 20 between the transistors 7 and 8 forms the output of the input stage.

If a logical 0 signal is present as the threshold reversal signal S at the connection terminal 16, then the p-channel field effect transistor 15 is made conducting. As a result, the load path of the p-channel field effect transistor 14 is short-circuited by that of the p-channel field effect transistor 15. This can be optimized (similarly to the situation of FIG. 1) by making the p-channel field effect transistor 15 substantially larger in size than the p-channel field effect transistor 14. In the case of a logical 0 signal as the threshold reversal signal S, it is accordingly substantially the p-channel field effect transistor 15 and the p-channel field effect transistor 7 that determine the threshold of the CMOS input stage. Conversely, if a logical 1 signal is present as the threshold reversal signal S at the connection terminal 16, then the p-channel field effect transistor 15 is blocked, and the load path of the p-channel field effect transistor 14, as a result of its series connection with the p-channel field effect transistor 7, then elevates the junction resistance of the p-channel part of the CMOS input stage, and thus varies the threshold of the input stage similarly to the first exemplary embodiment.

Naturally, other circuit configurations are also possible. The essential factor is that the configurations vary the threshold of a switching stage for various supply voltages. The threshold of the n-channel and/or of the p-channel FETs of the input stage can be varied.

Triggering of the threshold-switching device through the connection terminals 5 and 16 shown in FIGS. 1 and 2 may be performed automatically by an automatic recognition device, such as a comparator, that is constructed to recognize an elevated supply voltage and then trigger the threshold switching device accordingly. However, the triggering may also be performed manually by supplying a suitable threshold reversal signal S to the connection terminals 5 or 16, for instance in the burn-in mode.

In memory components, the threshold switching device is especially suitable for a test mode, which is activated by the instruction "Write CAS before RAS=WCBR". Various test modes can be established by means of various addresses at the respective address inputs.

We claim:

1. A CMOS input stage for operation with a supply voltage selectively having a first value or a second higher value, comprising:
    a supply voltage terminal selectively receiving a first value or a second value of a supply voltage during operation, a reference potential terminal, and an input terminal;
    a first field effect transistor of a first conduction type having a load path and a gate terminal, and a second field effect transistor of a second conduction type having a load path and a gate terminal;
    the load paths of said field effect transistors being connected in series between said supply voltage terminal and said reference potential terminal;
    an output terminal of the CMOS input stage formed between said first and second field effect transistors;
    the gate terminals of said field effect transistors being connected to said input terminal;
    control means for adjusting a resistance of the load path of at least one of said field effect transistors as a function of a particular value selected for the supply voltage;
    a connection terminal for a threshold reversal signal;
    said control means having two further field effect transistors of the second conduction type with load paths and gate terminals;
    the load paths of said further field effect transistors being connected in a series circuit, said series circuit being parallel to the load path of said second field effect transistor; and
    the gate terminal of one of said further field effect transistors being connected to said input terminal, and the gate terminal of the other of said further field effect transistors being connected to said connection terminal for the threshold reversal signal.

2. A CMOS input stage for operation with a supply voltage selectively having a first value or a second higher value, comprising:
    a supply voltage terminal selectively receiving a first value or a second value of a supply voltage during operation, a reference potential terminal, and an input terminal;
    a first field effect transistor of a first conduction type having a load path and a gate terminal, and a second field effect transistor of a second conduction type having a load path and a gate terminal;
    the load paths of said field effect transistors being connected in series between said supply voltage terminal and said reference potential terminal;
    an output terminal of the CMOS input stage formed between said first and second field effect transistors;
    the gate terminals of said field effect transistors being connected to said input terminal;
    control means for adjusting a resistance of the load path of at least one of said field effect transistors as a function of a particular value selected for the supply voltage;
    a connection terminal for a threshold reversal signal;
    said control means having two further field effect transistors of the first conduction type with load paths and gate terminals;
    the load paths of said further field effect transistors being connected in parallel and being connected between said supply voltage terminal and the series connection of the load paths of said first and second field effect transistors;
    the gate terminal of one of said further field effect transistors being connected to the input terminal, and the gate terminal of the other of said further field effect transistors being connected to said connection terminal for the threshold reversal signal.

3. A CMOS buffer stage, comprising:
    a CMOS input stage for operation with a supply voltage selectively having a first value or a second higher value, including:
        a supply voltage terminal selectively receiving a first value or a second value of a supply voltage during operation, a reference potential terminal, and an input terminal;
        a first field effect transistor of a first conduction type having a load path and a gate terminal, and a second field effect transistor of a second conduction type having a load path and a gate terminal;
        the load paths of said field effect transistors being connected in series between said supply voltage terminal and said reference potential terminal;
        an output terminal of the CMOS input stage formed between said first and second field effect transistors;
        the gate terminals of said field effect transistors being connected to said input terminal; and
        control means for adjusting a resistance of the load path of at least one of said field effect transistors as a function of a particular value selected for the supply voltage;
    an inverter having an input connected downstream of an output voltage side of said CMOS input stage and having an output; and
    a holding field effect transistor having a load path connected parallel to the load path of said first field effect transistor and having a gate terminal being connected to the output of said inverter.

4. The CMOS buffer stage according to claim 3, wherein said CMOS input stage includes:
   a connection terminal for a threshold reversal signal;
   said control means having two further field effect transistors of the second conduction type with load paths and gate terminals;
   the load paths of said further field effect transistors being connected in a series circuit, said series circuit being parallel to the load path of said second field effect transistor;
   the gate terminal of one of said further field effect transistors being connected to said input terminal, and the gate terminal of the other of said further field effect transistors being connected to said connection terminal for the threshold reversal signal.

5. The CMOS buffer stage according to claim 3, wherein said CMOS input stage includes:
   a connection terminal for a threshold reversal signal;
   said control means having two further field effect transistors of the first conduction type with load paths and gate terminals;
   the load paths of said further field effect transistors being connected in parallel and being connected between said supply voltage terminal and the series connection of the load paths of said first and second field effect transistors;
   the gate terminal of one of said further field effect transistors being connected to the input terminal, and the gate terminal of the other of said further field effect transistors being connected to said connection terminal for the threshold reversal signal.

* * * * *